United States Patent
Meusel

(10) Patent No.: US 11,127,873 B2
(45) Date of Patent: Sep. 21, 2021

(54) MONOLITHIC MULTIJUNCTION SOLAR CELL HAVING EXACTLY FOUR SUBCELLS

(71) Applicant: AZUR SPACE SOLAR POWER GMBH, Heilbronn (DE)

(72) Inventor: Matthias Meusel, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/034,669

(22) Filed: Sep. 28, 2020

(65) Prior Publication Data
US 2021/0098642 A1  Apr. 1, 2021

(30) Foreign Application Priority Data
Sep. 27, 2019 (EP) ..................... 19000434

(51) Int. Cl.
*H01L 31/0687* (2012.01)
*H01L 31/0725* (2012.01)
(Continued)

(52) U.S. Cl.
CPC .... *H01L 31/0687* (2013.01); *H01L 31/02167* (2013.01); *H01L 31/0725* (2013.01);
(Continued)

(58) Field of Classification Search
CPC ............. H01L 31/0687; H01L 31/0547; H01L 31/03046; H01L 31/02167; H01L 31/0725
See application file for complete search history.

(56) References Cited

U.S. PATENT DOCUMENTS 6,316,715 B1 * 11/2001 King ................... H01L 31/0687
136/255
6,660,928 B1  12/2003 Patton et al.
(Continued)

FOREIGN PATENT DOCUMENTS

DE  10 2017 200 700 A1  7/2018
EP     2 960 950 A1     12/2015
(Continued)

OTHER PUBLICATIONS

Liu et al., "Organometallic vapor phase epitaxy growth of upright metamorphic multijunction solar cells," J. of Crystal Growth, vol. 352, No. 1, pp. 196-189 (Nov. 9, 2011).
(Continued)

*Primary Examiner* — Golam Mowla
(74) *Attorney, Agent, or Firm* — Muncy, Geissler, Olds & Lowe, P.C.

(57) ABSTRACT

A monolithic multijunction solar cell having exactly four subcells, an uppermost first subcell having a layer made up of a component having the elements AlInP, and the lattice constant a1 of the layer being between 0.572 nm and 0.577 nm, and the indium content being between 64% and 75%, and the Al content being between 18% and 32%, and the third subcell having a layer made up of a compound having at least the elements GaInAs, and the lattice constant of the layer being between 0.572 and 0.577, and the indium content of the layer being greater than 17%, and the second subcell comprising a layer including a compound which has at least the elements GaInAsP, the layer having an arsenic content between 22% and 33% and an indium content between 52% and 65%. and the lattice constant a2 being between 0.572 and 0.577.

11 Claims, 1 Drawing Sheet

| SC1 |
|-----|
| OTD |
| SC2 |
| MTD |
| SC3 |
| UTD |
| HS |
| MP |
| SC4 |

(51) Int. Cl.
*H01L 31/0216* (2014.01)
*H01L 31/054* (2014.01)
*H01L 31/0304* (2006.01)

(52) U.S. Cl.
CPC .... *H01L 31/03046* (2013.01); *H01L 31/0547* (2014.12); *Y02E 10/544* (2013.01)

(56) References Cited

U.S. PATENT DOCUMENTS

| | | | | |
|---|---|---|---|---|
| 2002/0195137 | A1* | 12/2002 | King | H01L 31/1852 |
| | | | | 136/249 |
| 2005/0155641 | A1* | 7/2005 | Fafard | B82Y 10/00 |
| | | | | 136/249 |
| 2006/0144435 | A1* | 7/2006 | Wanlass | H01L 31/0687 |
| | | | | 136/249 |
| 2008/0163920 | A1* | 7/2008 | Meusel | H01L 31/02327 |
| | | | | 136/246 |
| 2012/0211068 | A1* | 8/2012 | Cornfeld | H01L 31/06875 |
| | | | | 136/255 |
| 2012/0240987 | A1* | 9/2012 | King | H01L 31/0687 |
| | | | | 136/255 |
| 2015/0053257 | A1* | 2/2015 | Dimroth | H01L 31/074 |
| | | | | 136/255 |
| 2016/0380142 | A1* | 12/2016 | Guter | H01L 31/0547 |
| | | | | 136/255 |
| 2017/0170354 | A1 | 6/2017 | Ebel et al. | |
| 2019/0378948 | A1 | 12/2019 | Dimroth et al. | |
| 2020/0243702 | A1* | 7/2020 | Meusel | H01L 31/02167 |

FOREIGN PATENT DOCUMENTS

| | | |
|---|---|---|
| EP | 3 179 521 A1 | 6/2017 |
| WO | WO 2016/015467 A1 | 2/2016 |

OTHER PUBLICATIONS

Vaisman et al., "Direct-Gap 2.1-2.2 eV AlInP Solar Cells on GaInAs/GaAs Metamorphic Buffers," IEEE J. of Photovoltaics, vol. 6, No. 2, pp. 571-577 (Mar. 2, 2016).

Van Leest et al., "Recent Progress of Solar Cell Development for CPV Applications at AzurSpace," Proc. of the 36th EU-PVSEC, pp. 586-589 (Sep. 9-13, 2019).

Sharps et al., "Development of 20% Efficient GaInAsP Solar Cells," Proc. of the Photvoltaic Specialists Conf., pp. 633-638 (May 10-14, 1993).

Dimroth et al., "Wafer bonded four-junction GaInP/GaAsP/GaInAs concentrator solar cells with 44.7% efficiency," Prog. Photovolt. Res. Appl., pp. 277-282 (2014).

Mendorf, "Spatially Resolved Characterization of Segregation Phenomena in $Ga_xIn_{1-x}As_yP_{i-y}$ Semiconductor Heterolayers in the Scanning Transmission Electron Microscope," Dissertation, Dept of Elect Eng at Gerhard Marcator Univ., pp. 1-136 (Dec. 7, 2001) with Eng Trans of relevant parts—pp. 44-46 (part 2.2.2) and pp. 74-75 (part 5.1).

\* cited by examiner

MONOLITHIC MULTIJUNCTION SOLAR CELL HAVING EXACTLY FOUR SUBCELLS

This nonprovisional application claims priority under 35 U.S.C. § 119(a) to European Patent Application No. 19 000 434.1, which was filed on Sep. 27, 2019, and which is herein incorporated by reference.

BACKGROUND OF THE INVENTION

Field of the Invention

The present invention relates to a monolithic metamorphic four-junction solar cell.

Description of the Background Art

The manufacturing of a four-junction solar cell having a subcell made from GaInAsP is known from the publication, "Wafer-bonded four-junction GaInP/GaAs/GaInAsP/GaInAs concentrator solar cells with 44.7% efficiency," by Dimroth et al in Progr. Photovolt: Res. Appl. 2014; 22: 277-282. In the aforementioned publication, a GaInAsP solar cell having an energy gap of approximately 1.12 eV is deposited in a lattice-matched manner, based on an InP substrate.

The upper subcells having a higher band gap are manufactured in reverse order on a GaAs substrate in a second deposition step. The entire multi-junction solar cell is formed by a direct semiconductor bond of the two epitaxial wafers, followed by a removal of the GaAs substrate and additional process steps. However, the manufacturing process is extremely complex and cost-intensive.

Other multijunction solar cells having a GaInAsP subcell are known from EP 2 960 950 A1 and EP 3 179 521 A1, which corresponds to US 2017/0170354, which is incorporated herein by reference. Four-junction Ge/InGaAs/InGaAsP/AlGaInP solar cells having a metamorphic buffer are known from U.S. Pat. No. 6,660,928 B1 as well as WO 2016/015467 A1.

In addition, the fact that the GaInAsP compound, in particular, has a significant miscibility gap is known from the dissertation by Mendorf, "Ortsaufgelöste Charakterisierung von Entmischungsphänomen in $Ga_xIn_{1-x}As_yP_{1-y}$-Halbleiterheteroschichten im Raster-Transmissions-selektronenmikroskop" (Spatially Resolved Characterization of Segregation Phenomena in $Ga_xIn_{1-x}As_yP_{1-y}$ Semiconductor Heterolayers in the Scanning Transmission Electron Microscope).

In the case of GaInAsP, a wide range of latter constants and band gaps cannot be implemented hereby, in particular with the high quality requirements of layers for manufacturing high-performance multijunction solar cells having an efficiency above 32% at AM0 or above 43% with concentrated light.

While it may be assumed that, during epitaxy, the miscibility gap drops at a higher temperature, it is known, however, that a Ge autodoping takes place in multijunction cells having a Ge lowermost cell. If the temperatures are increased, however, the autodoping results in significant yield problems during the epitaxial deposition.

Optimizing the radiation hardness, in particular also for very high radiation doses, is an important objective in the development of space solar cells. In addition to increasing the beginning-of-life (BOL) efficiency, the goal is also to boost the end-of-life (EOL) efficiency.

The manufacturing costs are also extremely important. The industrial standard at the present point in time is given by lattice-matched, three-junction solar cells and the metamorphic GaInP/GaInAs/Ge three-junction solar cells.

SUMMARY OF THE INVENTION

It is therefore an object of the present invention to provide a device which refines the prior art.

In an exemplary embodiment, a monolithic multijunction solar cell having exactly four subcells is provided.

The multijunction solar cell includes an uppermost first subcell having a first band gap Eg1 in a range between 1.85 eV and 2.07 eV.

An underlying second subcell having a second band gap Eg2 in the range between 1.41 eV and 1.53 eV is disposed below the first subcell.

An underlying third subcell having a third band gap Eg3 in the range between 1.04 eV and 1.18 eV is disposed below the second subcell.

A lowermost fourth cell is disposed below the third subcell, the fourth subcell predominantly comprising germanium or being made up of germanium and having a band gap between 0.65 eV and 0.68 eV.

A metamorphic buffer is formed between the third subcell and the fourth subcell, the metamorphic buffer including a sequence of at least three layers, and the lattice constant increasing from layer to layer in the sequence of layers in the direction of the third subcell.

Each of the four subcells includes an emitter and a base.

The uppermost first subcell has a layer made from a compound having at least the elements AlInP. The thickness of the layer is greater than 100 nm and is formed as part of the emitter and/or as part of the base and/or as part of the space-charge zone situated between the emitter and the base. Lattice constant a1 of the layer is between 0.572 nm and 0.577 nm. With respect to the elements of the III main group, the indium content of the layer is between 64% and 75%, and the Al content of the layer is between 18% and 32%.

The third subcell has a layer made from a compound which includes at least the elements GaInAs, the thickness of the layer being greater than 100 nm, and formed as part of the emitter and/or as part of the base and/or as part of the space-charge zone situated between the emitter and the base. Lattice constant a3 of the layer is between 0.572 nm and 0.577 nm, and the indium content of the layer is greater than 17% with respect to the elements of the III main group.

The second subcell has a layer having a compound which includes at least the elements GaInAsP, the thickness of the layer being greater than 100 nm, and the layer being formed as part of the emitter and/or as part of the base and/or as part of the space-charge zone situated between the emitter and the base. The layer has an arsenic content between 22% and 33% with respect to the elements of the V group and an indium content between 52% and 65% with respect to the elements of the III main group. Lattice constant a2 is between 0.572 nm and 0.577 nm and differs from the lattice constant of the layer of the third subcell by less than 0.3% or less than 0.2%.

It should be noted that the sunlight is always first irradiated through the uppermost subcell having the largest band gap. In other words, the solar cell stack first absorbs the short-wave component of the light via the uppermost subcell. In the present case, the photons thus first flow through the first subcell and then through the second subcell and the third subcell and the fourth subcell. In an equivalent diagram, the individual subcells of the multijunction solar cell are connected in series, i.e. the subcell having the lowest current has a limiting effect.

It should also be noted that the terms, emitter and base, are understood to be either the p-doped or the n-doped layers in the particular subcell, the emitter always being n-doped.

It should also be noted that, under the term, "in the present case," the chemical abbreviations of elements are used synonymously with the full terms.

Studies have surprisingly shown that GaInAsP in the aforementioned composition range may be deposited in surprisingly good quality by means of MOVPE. This overcomes the preconception that GaInAsP in the aforementioned composition range, which is within the miscibility gap, may not be deposited in the quality necessary for solar cells. It has also been demonstrated that, by incorporating the InGaAsP subcell, the radiation hardness, and thereby the so-called EOL efficiency, may be improved.

It is understood that the indicated arsenic content, in particular, is related to the total content of the group V atoms. Similarly, the indicated indium content is related to the total content of the group III atoms. In the $Ga_{1-x}In_x$-$As_yP_{1-y}$ compound, therefore, the indium content has the value X, and the arsenic content has the value Y, and this results in a Y value of 0.25 for an arsenic content of 25%.

Moreover, a semiconductor mirror is disposed between the third subcell and the fourth subcell. Although those skilled in the art also know that an incorporation of a Bragg reflector will increase the total thickness of the multijunction solar cell and the complexity of the four-junction cell, and the yield tends to drop, it has surprisingly been shown, however, that the radiation hardness of the multijunction solar cell increases. The increase in radiation hardness, i.e. the increase in efficiency, is particularly surprising, since it is known that the third subcell, in particular, as the InGaAsP subcell, is particularly radiation-hard. Moreover, the incorporation of the semiconductor mirror above the fourth subcell is problematic, at least in that the incorporation of the semiconductor mirror causes a reduction in the light incidence onto the fourth subcell.

In another refinement, the lattice constant of the layer of the first subcell differs from the lattice constant of the layer of the third subcell by less than 0.3% or less than 0.2%.

In an embodiment, no semiconductor bond is formed between the four subcells. It should be noted that the term "semiconductor bond" covers, in particular, the fact that no direct semiconductor bond is formed between two arbitrary subcells of the solar cell stack. The solar cell, therefore, is not manufactured from two substacks, which were deposited on different substrates and are subsequently joined via a semiconductor bond. In particular, the solar cell stack does not have any amorphous intermediate layers, which may arise during bonding.

In a refinement, the thickness of the layer in the second subcell and the thickness of the layer in the third subcell is greater than 0.4 µm or greater than 0.8 µm in each case.

In a specific embodiment, in the second subcell, the arsenic content of the layer is between 23% and 33%, and the indium content of the layer is between 52% and 63%.

In the second subcell, the arsenic content of the layer can be between 24% and 33%, and the indium content of the layer is between 52% and 61%.

The layer of the second subcell can be at least particular p-doped with the dopants Zn or C or Mg or at least partially n-doped with the dopants Si or Te or Se.

The layer of the second subcell can form both an n-doped emitter and a p-doped base.

The dopant concentration can increase by more than $1 \times 10^{17}/cm^3$ in the direction of the third subcell at least over a portion of the layer of the second subcell.

At least one part of the layer of the second subcell can form at least one part of the emitter of the second subcell, and has a dopant concentration of less than $5 \times 10^{17}/cm^3$ in this location.

The second subcell can be designed as a so-called homo subcell, or all subcells are designed as homo subcells, i.e. the emitter layer and the base layer of the particular subcell have the same number of elements in combination with preferably the same stoichiometry.

The uppermost layer of a subcell, i.e. the emitter layer in this case, can be designed as the n layer. The emitter layer can always be above the base layer. In one refinement, in particular, no intrinsic layer is formed between the emitter layer and the base layer.

A passivation layer made up of a compound having at least the elements GaInP is disposed above the layer of the second subcell and below the first subcell. In other words, the passivation layer is formed between the first subcell and the second subcell.

A passivation layer made up of a compound having at least the elements GaInP can be formed below the layer of the second subcell and above the metamorphic buffer.

The second subcell and/or the further subcells do not have a multijunction quantum well structure.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
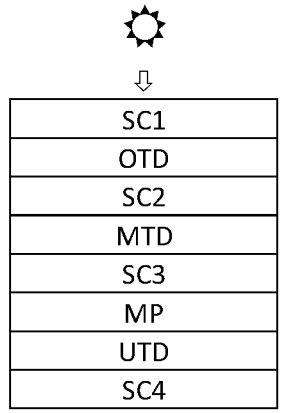
FIG. 1 shows a layer structure of an embodiment of a four-junction solar cell.

The illustration in FIG. 1 shows an embodiment of a four-junction solar cell, including an uppermost subcell SC1 on an underlying second subcell SC2.

An upper tunnel diode OTD is formed between first subcell SC1 and second subcell SC2.

A third subcell SC3 is disposed below second subcell SC2. A middle tunnel diode MTD is formed between second subcell SC2 and third subcell SC3.

A fourth subcell SC4 is disposed below third subcell SC3. A middle tunnel diode MTD is formed between third subcell SC3 and fourth subcell SC4.

A metamorphic buffer MP is disposed between third subcell SC3 and middle tunnel diode MTD.

Figure 2:
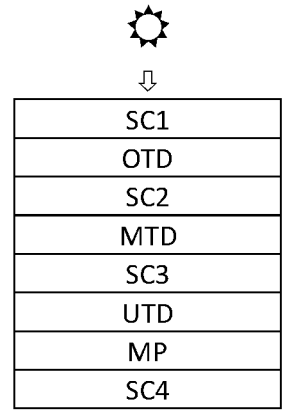
FIG. 2 shows a layer structure of an embodiment of a four-junction solar cell.

The illustration in FIG. 2 shows a second exemplary embodiment of a four-junction solar cell. Only the differences from the first specific embodiment are explained below.

Lower tunnel diode UTD is formed between third subcell SC3 and fourth subcell SC4, metamorphic buffer MP now being disposed between lower tunnel diode UTD and the fourth subcell.

Figure 3:
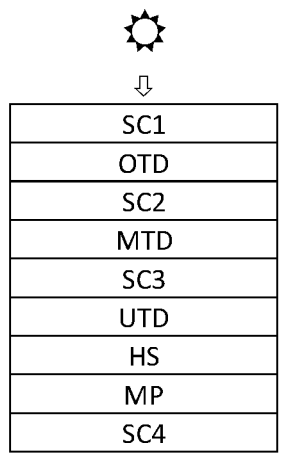
FIG. 3 shows a layer structure of an embodiment of a four-junction solar cell.

The illustration in FIG. 3 shows a third exemplary embodiment of a four-junction solar cell. Only the differences from the second specific embodiment are explained below.

A semiconductor mirror HS is disposed between lower tunnel diode UTD and metamorphic buffer MP. In other words, first lower tunnel diode UTD and then semiconductor mirror HS and then metamorphic buffer MP are formed below third subcell SC3 before lowermost fourth subcell SC4 is subsequently formed.

Figure 4:
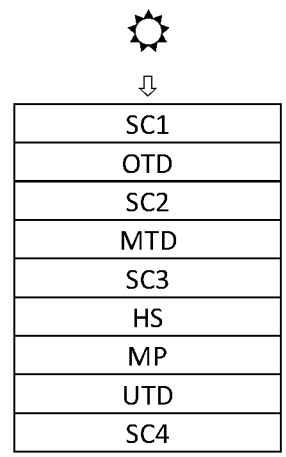
FIG. 4 shows a layer structure of an embodiment of a four-junction solar cell.

The illustration in FIG. 4 shows a fourth exemplary embodiment of a four-junction solar cell. Only the differences from the third specific embodiment are explained below.

First semiconductor mirror HS and then metamorphic buffer MP and then lower tunnel diode UTD are formed below third subcell SC3, before lowermost fourth subcell SC4 is subsequent formed, the aforementioned layers being disposed in the specified order.

Figure 5:
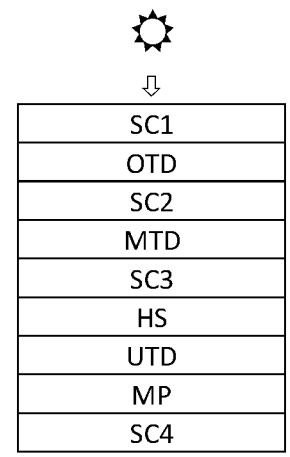
FIG. 5 shows a layer structure of an embodiment of a four-junction solar cell.

The illustration in FIG. 5 shows a fifth exemplary embodiment of a four-junction solar cell. Only the differences from the fourth specific embodiment are explained below.

First semiconductor mirror HS and then lower tunnel diode UTD and then metamorphic buffer MP are formed below third subcell SC3, before lowermost fourth subcell SC4 is subsequent formed, the aforementioned layers being disposed in the specified order.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monolithic multijunction solar cell having exactly four subcells, the monolithic multijunction solar cell comprising:
    a first subcell having a first band gap in a range between 1.85 eV and 2.07 eV;
    a second subcell having a second band gap Eg2 in a range between 1.41 eV and 1.53 eV;
    a third subcell having a third band gap Eg3 in a range between 1.04 eV and 1.18 eV; the second subcell being arranged between the first subcell and the third subcell;
    a lowermost fourth subcell formed of germanium and having a band gap between 0.65 eV and 0.68 eV;
    a semiconductor mirror arranged between the third subcell and the fourth subcell; and
    a metamorphic buffer formed between the third subcell and the fourth subcell, the metamorphic buffer including a sequence of at least three layers, and a lattice constant increasing from layer to layer in the sequence of layers in a direction of the third subcell,
    wherein each of the four subcells includes an emitter and a base,
    wherein the first subcell includes a layer made up of a compound having at least the elements Al and In and P, and a thickness of the layer is greater than 100 nm, and the layer is formed as part of the emitter and/or as part of the base and/or as part of a space-charge zone situated between the emitter and the base, and the lattice constant of the layer is between 0.572 nm and 0.577 nm, and, with respect to the elements of the III main group, the indium content of the layer is between 64% and 75% and the Al content of the layer is between 18% and 32%,
    wherein the third subcell includes a layer made up of a compound having at least the elements Ga and In and As, and a thickness of the layer is greater than 100 nm, and the layer is formed as part of the emitter and/or as part of the base and/or as part of a space-charge zone situated between the emitter and the base, and the lattice constant of the layer is between 0.572 nm and 0.577 nm, and an indium content of the layer is greater than 17% with respect to the elements of the III main group,
    wherein the second subcell includes a layer including a compound which has at least the elements Ga and In and As and P, and in which the thickness of the layer in the second subcell is greater than 100 nm, and the layer is formed as part of the emitter and/or as part of the base and/or as part of a space-charge zone situated between the emitter and the base, the layer having an arsenic content between 22% and 33% with respect to the elements of the V main group and an indium content between 52% and 65% with respect to the elements of the III main group, the lattice constant is between 0.572 nm and 0.577 nm, and the lattice constant differs from the lattice constant of the layer of the third subcell by less than 0.3% or less than 0.2%, and
    wherein at least one part of the layer of the second subcell forms at least one part of the emitter of the second subcell, and has a dopant concentration of less than $5 \times 10^{17}/cm^3$.

2. The multijunction solar cell according to claim 1, wherein the lattice constant of the layer of the first subcell differs from the lattice constant of the layer of the third subcell by less than 0.3% or less than 0.2%.

3. The multijunction solar cell according to claim 1, wherein no semiconductor bond is formed between the four subcells.

4. The multijunction solar cell according to claim 1, wherein the thickness of the layer in the second subcell and the thickness of the layer in the third subcell is greater than 0.4 μm or greater than 0.8 μm.

5. The multijunction solar cell according to claim 1, wherein, in the second subcell, the arsenic content of the layer is between 24% and 33%, and the indium content of the layer is between 52% and 61%.

6. The multijunction solar cell according to claim 1, wherein the layer of the second subcell is at least partially p-doped with the dopants Zn or C or Mg or at least partially n-doped with the dopants Si or Te or Se.

7. The multijunction solar cell according to claim 1, wherein the layer of the second subcell forms both an n-doped emitter and a p-doped base.

8. The multijunction solar cell according to claim 1, wherein the dopant concentration increases by more than $1 \times 10^{17}/cm^3$ in the direction of the third subcell at least over a portion of the layer of the second cell.

9. The multijunction solar cell according to claim 1, wherein a passivation layer made up of a compound having at least the elements GaInP is formed above the layer of the second subcell and below the first subcell.

10. The multijunction solar cell according to claim 1, wherein a passivation layer made up of a compound having at least the elements GaInP is formed below the layer of the second subcell and above the metamorphic buffer.

11. The multijunction solar cell according to claim 1, wherein the second subcell does not have a multijunction quantum well structure.

* * * * *